United States Patent
Lu et al.

(10) Patent No.: US 8,071,953 B2
(45) Date of Patent: Dec. 6, 2011

(54) ACF ATTACHMENT FOR RADIATION DETECTOR

(75) Inventors: Pinghe Lu, Victoria (CA); Henry Chen, Victoria (CA); Glenn Bindley, West Vancouver (CA)

(73) Assignee: Redlen Technologies, Inc., Saanichton, BC (CA)

( * ) Notice: Subject to any disclaimer, the term of this patent is extended or adjusted under 35 U.S.C. 154(b) by 536 days.

(21) Appl. No.: 12/111,413

(22) Filed: Apr. 29, 2008

(65) Prior Publication Data

US 2009/0321651 A1 Dec. 31, 2009

(51) Int. Cl.
H01L 27/146 (2006.01)

(52) U.S. Cl. .................. 250/370.13; 977/762

(58) Field of Classification Search ............ 250/370.09, 250/370.13; 257/428
See application file for complete search history.

(56) References Cited

U.S. PATENT DOCUMENTS

| | | | |
|---|---|---|---|
| 4,479,131 A | 10/1984 | Rogers et al. | |
| 5,616,928 A * | 4/1997 | Russell et al. | 250/515.1 |
| 6,002,134 A | 12/1999 | Lingren | |
| 6,027,766 A | 2/2000 | Greenberg et al. | |
| 6,037,595 A | 3/2000 | Lingren | |
| 6,046,454 A | 4/2000 | Lingren et al. | |
| 6,243,441 B1 | 6/2001 | Zur | |
| 6,262,408 B1 | 7/2001 | Izumi et al. | |
| 6,291,763 B1 | 9/2001 | Nakamura | |
| 6,310,281 B1 | 10/2001 | Wendt et al. | |
| 6,340,812 B1 | 1/2002 | Izumi et al. | |
| 6,340,818 B1 | 1/2002 | Izumi et al. | |
| 6,342,700 B1 | 1/2002 | Izumi et al. | |
| 6,344,370 B1 | 2/2002 | Izumi et al. | |
| 6,350,946 B1 | 2/2002 | Miyake et al. | |
| 6,372,538 B1 | 4/2002 | Wendt et al. | |
| 6,392,217 B1 | 5/2002 | Teranuma et al. | |
| 6,398,624 B1 | 6/2002 | Izumi et al. | |
| 6,413,581 B1 | 7/2002 | Greenberg et al. | |
| 6,512,233 B1 | 1/2003 | Sato et al. | |
| 6,593,577 B2 | 7/2003 | Izumi | |
| 6,722,159 B2 | 4/2004 | Greenberg et al. | |
| 6,803,109 B2 | 10/2004 | Qiu et al. | |
| 6,825,473 B2 | 11/2004 | Watanabe | |
| 6,909,100 B2 * | 6/2005 | Sognefest et al. | 250/370.13 |

(Continued)

FOREIGN PATENT DOCUMENTS

KR 2001-0069358 A 7/2001

(Continued)

OTHER PUBLICATIONS

International Search Report and Written Opinion mailed Dec. 1, 2009, in PCT/US2009/040927, 11 pages.

(Continued)

*Primary Examiner* — David Porta
*Assistant Examiner* — Faye Boosalis
(74) *Attorney, Agent, or Firm* — The Marbury Law Group, PLLC

(57) ABSTRACT

A device includes (a) radiation detector including a semiconductor substrate having opposing front and rear surfaces, a cathode electrode located on the front surface of said semiconductor substrate, and a plurality of anode electrodes on the rear surface of said semiconductor substrate, (b) a printed circuit board, and (c) an electrically conductive polymeric film disposed between circuit board and the anode electrodes. The polymeric film contains electrically conductive wires. The film bonds and electrically connects the printed circuit board and anode electrodes.

26 Claims, 7 Drawing Sheets

U.S. PATENT DOCUMENTS

| | | | |
|---|---|---|---|
| 6,949,749 B2 | 9/2005 | Tokuda et al. |
| 6,978,534 B2 | 12/2005 | Sakaki |
| 6,981,758 B2 | 1/2006 | Cruz-Uribe et al. |
| 6,995,840 B2 | 2/2006 | Hagler |
| 6,999,165 B2 | 2/2006 | Hagler |
| 7,004,376 B2 | 2/2006 | Ashida |
| 7,030,169 B2 | 4/2006 | Kalgutkar et al. |
| 7,049,002 B2 | 5/2006 | Greenberg et al. |
| 7,064,152 B2 | 6/2006 | Kalgutkar et al. |
| 7,117,588 B2 | 10/2006 | Vafi et al. |
| 7,125,101 B2 | 10/2006 | Cruz-Uribe et al. |
| 7,128,428 B2 | 10/2006 | Takahashi et al. |
| 7,169,209 B2 | 1/2007 | Nakata et al. |
| 7,170,062 B2 | 1/2007 | Vuorela |
| 7,189,971 B2 | 3/2007 | Spartiotis et al. |
| 7,194,197 B1 | 3/2007 | Wendt et al. |
| 7,235,736 B1 | 6/2007 | Buller et al. |
| 7,239,164 B2 | 7/2007 | Tamaki |
| 7,267,850 B2 | 9/2007 | Coggio et al. |
| 7,301,155 B2 | 11/2007 | Tokuda et al. |
| 7,348,599 B2 | 3/2008 | Yamazaki et al. |
| 7,491,572 B2 | 2/2009 | Kim et al. |
| 2002/0014593 A1 | 2/2002 | Tokuda et al. |
| 2002/0074503 A1 | 6/2002 | Watanabe |
| 2002/0134943 A1 | 9/2002 | Izumi |
| 2003/0215056 A1 | 11/2003 | Vuorela |
| 2007/0075408 A1 | 4/2007 | Shibayama et al. |
| 2007/0085180 A1 | 4/2007 | Kim et al. |

FOREIGN PATENT DOCUMENTS

| | | |
|---|---|---|
| KR | 10-0539082 B1 | 12/2005 |
| WO | WO 2004/097938 A1 | 11/2004 |

OTHER PUBLICATIONS

U.S. Appl. No. 11/527,707, filed Sep. 27, 2006, Chen et al.
U.S. Appl. No. 11/633,091, filed Dec. 4, 2006, Chen et al.
U.S. Appl. No. 11/642,819, filed Dec. 21, 2006, Chen et al.
U.S. Appl. No. 11/785,319, filed Apr. 17, 2007, Chen et al.
Gasse et al., "Assessment of advanced Anisotropic Conductive Films for Flip-Clip Interconnection based on Z axis conductors," Nuclear Science Symposium Conference Record, 2003 IEEE, Oct. 2003, vol. 1, 237-241.
"Highly Electrically and Thermally Conductive Z-axis Film Adhesives," *btech*corp, Nov. 2007, 17 pages.
International Bureau of WIPO. International Preliminary Report on Patentability, Intl. Application PCT/US09/40927. Nov. 11, 2010. 6 pages.

\* cited by examiner

| Sample | ACF type | Edge coating materials | Mean FWHM before coating, after coating, after hash test | Leakage current at 1500 V (nA) before coating, after coating, after hash test |
|---|---|---|---|---|
| A | Thermoplastic based | Solder mask | 5.8%, 6.4%, 8.8% | 44, 33, 33 |
| B | Thermoplastic based | Solder mask | 6.1%, 6.1%, 6.5% | 87, 83, 76 |
| C | Thermoplastic based | Solder mask | 6.0%, 6.7%, 7.0% | 99, 210, 124 |
| D | Epoxy based | Solder mask | 5.9%, 6.4%, 6.7% | 79, 100, 145 |
| E | Thermoplastic based | silicone | 6.6%, 6.8%, 8.8% | 71, 58, 58 |
| F | Epoxy based | silicone | 6.4%, 6.9%, 6.9% | 57, 109, 102 |
| G | Thermoplastic based | UV cure epoxy | 6.4%, 6.4%. 6.5% | 72, 60, 68 |

Fig. 6

ACF ATTACHMENT FOR RADIATION DETECTOR

BACKGROUND OF THE INVENTION

The present invention relates generally to detectors for gamma-ray and X-ray detection devices.

Anisotropic conductive films (ACFs) (also referred to as anisotropic conductive adhesives (ACAs)) consist of mixtures of conductive fillers in an insulating polymer. ACFs are capable of electrically conducting in one direction (the film thickness or Z axis) and insulating in other two directions (x and y axis). ACF has become important interconnect technology for devices which are not significantly sensitive to high pressure and high temperature, such as silicon devices or substrates used in advanced display assembly, contactless smart-card module assembly, and bare chip attach on rigid and flexible substrates.

SUMMARY OF THE INVENTION

In one embodiment, a device comprises: (a) a radiation detector comprising a semiconductor substrate having opposing front and rear surfaces, a cathode electrode located on the front surface of said semiconductor substrate, and a plurality of anode electrodes on the rear surface of said semiconductor substrate, (b) a printed circuit board, and (c) an electrically conductive polymeric film disposed between the printed circuit board and the anode electrodes, wherein the polymeric film comprises electrically conductive wires electrically connecting the radiation detector with the printed circuit board.

In another embodiment, a method of electrically connecting a radiation detector to a printed circuit board comprises (a) providing a radiation detector comprising a semiconductor substrate having opposing front and rear surfaces, a cathode electrode located on the front surface of said semiconductor substrate, and a plurality of anode electrodes on the rear surface of said semiconductor substrate, (b) providing a printed circuit board, (c) providing an electrically conductive polymeric film between the printed circuit board and the plurality of anodes, and (d) bonding the radiation detector to the printed circuit board using at least one of a bonding temperature of 135° C. or less and a compressive force of about 35 psi or less.

BRIEF DESCRIPTION OF THE DRAWINGS

FIG. 6 is a table showing current leakage of a detector device with various edge coating materials.

DETAILED DESCRIPTION OF THE PREFERRED EMBODIMENTS

The following definitions are used herein:

Cathode electrode: the electrode on one major surface of the detector substrate where incident gamma rays or x-rays enter the detector, i.e. positioned towards the radiation source.

Anode electrodes: segmented electrode contacts located on the rear surface of the substrate, i.e. positioned away from the radiation source.

Interpixel or inter pixel: the region or gap separating pixel electrodes. For electrode configurations with non-pixellated discrete contact segments the term is equivalently applied to the gap between contact segments.

Radiation Detector Design

Radiation detectors can be configured in a variety of ways. A common configuration comprises a cathode electrode and a plurality of anode electrodes located on opposite sides of a semiconductor plate or substrate. Typically these radiation detectors have pixilated anode electrode arrays fabricated by various deposition and lithography processes resulting in a gap between pixels, termed the interpixel gap or interpixel region.

In the preferred embodiments, the radiation detectors comprise a semiconductor material, such as a semiconductor material preferably comprising CdZnTe (CZT) or CdTe. Although other types of semiconductor materials exemplified by lead iodide, thallium bromide, gallium arsenide or silicon may be used.

More preferred is $Cd_{(1-x)}Zn_xTe$ (where x is less than or equal to 0.5), a wide band gap ternary II-VI compound semiconductor with unique electronic properties. This type of semiconductor is useful in gamma-ray and X-ray detectors which are used as spectrometers that operate at room temperature for nuclear radiation detection, spectroscopy and medical imaging applications.

Figure 1:
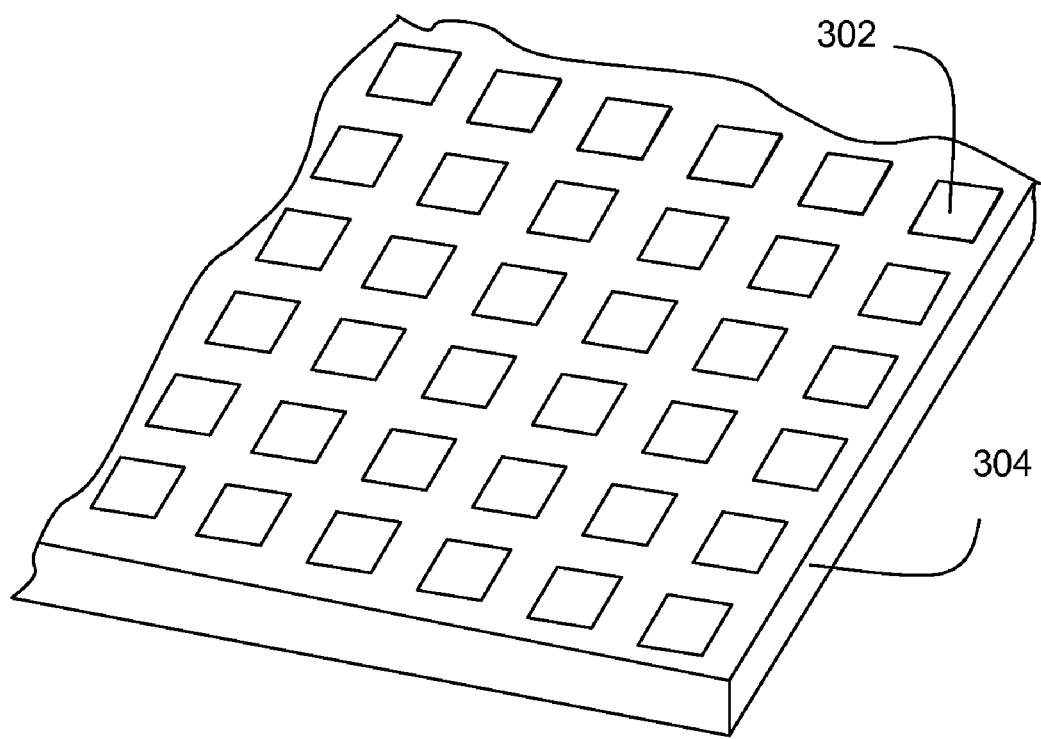
FIG. 1 is a perspective view of a CZT substrate with anode electrode pixels.

Illustrated in FIG. 1, is an example of pixellated anode electrodes 302 formed on a semiconductor substrate 304, such as a CZT substrate (also referred to as a "tile"). The cathode electrode is formed on the bottom side of the substrate 304.

FIGS. 2A-I illustrate, without any intent to limit the present embodiments, an example of steps in method of forming tri-layer metal contacts on a semiconductor substrate at positions (pixels) for defining radiation detector cells with an interpixel gap with high resistivity between the detector cells. In this example, it is assumed that the semiconductor substrate is made of cadmium zinc telluride (CdZnTe) or cadmium telluride (CdTe), although it will be appreciated that other semiconductor materials, for example lead iodide, thallium bromide, gallium arsenide or silicon, can be used. Also, it will be assumed that the metal used for the metallization layer and the contacts is gold, although it will be appreciated that other metals, alloys or other conductive materials, for example platinum or indium, could be used.

Thus, FIGS. 2A-2I are cross-sectional views from the side of a detector substrate at various stages in the formation of gold contacts on a CdZnTe substrate. The detailed features and structure at each step of the process are shown, resulting in an array of anode contact pixels on the rear surface of the CZT (drawn as facing up in this illustration), and a single cathode electrode on the front surface of the CZT tile (drawn as facing down in this illustration). In this example, two additional contact layers are added on to the pixilated primary contact layer on the rear side, for improved device assembly. The process can be applied to any array size and pixel configuration for CZT devices. A typical device size is a 20×20×5 mm detector, having 8×8 pixels or 11×11 pixels depending on the application. As a precursor to contact fabrication, the CZT wafer is polished and etched such that high quality clean crystal surfaces are prepared for the deposition process.

Figure 2A:
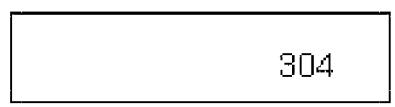
FIGS. 2A-I are schematic cross-sectional views of a method of making a detector at various stages in the formation of contacts thereon.

The direct lithography fabrication process is described with reference to FIGS. 2A-I, and for the case of the primary contact being gold, with two additional contact layers, and for simultaneous forming of the cathode contact on the opposing side of the CZT tile or substrate 304 shown in FIG. 2A.

Figure 2B:
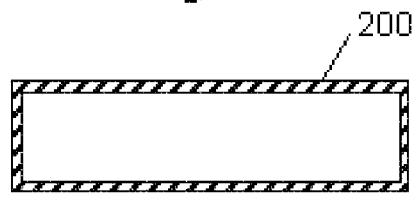

In step 1, shown in FIG. 2B a primary layer of gold 200 is deposited on the CZT tile 304. The gold layer 200 may be deposited by electroless deposition. Alternatively the gold layer 200 may be deposited by other known techniques, such as sputtering. The CZT tiles are first etched in Bromine-Methanol solution followed by methanol rinsing, as is well known. The clean CZT tiles 304 are dipped in an electroless gold solution for several minutes depositing a gold layer 200, then the tile is removed and rinsed with methanol. Typical thickness of deposition is equal or more than 100 nm. The deposited gold may be annealed at 90 deg C. for 15 minutes to increase adhesion to the substrate. An adhesion test can be done after a few hours using Scotch tape to confirm quality of the adhesion.

Figure 2C:
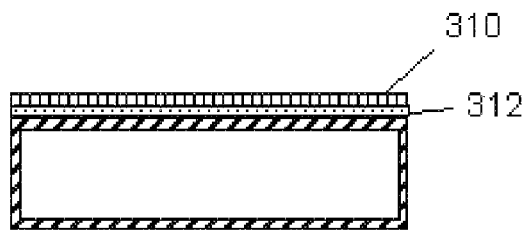

In an optional step 2 shown in FIG. 2C, two additional contact layers are deposited onto the rear side (anode side to be pixilated) of the tile, over the primary contact layer 200 on the rear side. In this example, a Ni layer 312 is deposited using sputtering or a thermal evaporation process to a thickness<100 nm and nominally 50 nm. Then another gold layer 310 is deposited using sputtering, thermal evaporation and/or an electroless process to a thickness<50 nm and nominally 20 nm. Alternative conductive contact material can be substituted for either or both of the additional contact layers.

Figure 2D:
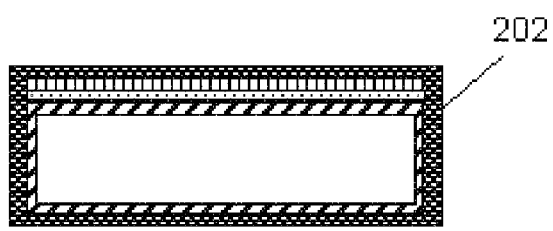

In step 3, as shown in FIG. 2D, a photoresist 202 is applied over the contact layer(s). Tiles 304 are dipped in resist, for example Shipley 1805 resist. Excessive resist is removed if necessary from the edge using a Q-tip, making sure the resist does not form any edge bead (especially on the pixilated face) as this would be detrimental for the pixel quality. Generally, the least possible amount of resist should remain on the pixilated face. The resist should be dried out for 10 minutes with the pixilated face kept up and horizontal.

The resist coating is hardened in step 4 by baking for 10 minutes at 90° C. This step is done to drive excess solvent out of the resist. The tile is now prepared for lithography exposure.

Figure 2E:
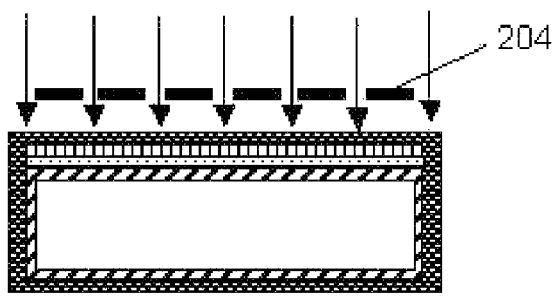

In step 5, as shown in FIG. 2E a pixel pattern is formed on the rear side of the tile 304 by photolithography. A UV mask 204 is aligned over the CZT tile surface, and the positive resist is exposed to UV. The direct lithography mask shades regions of the resist in a selected pixel pattern and exposes interpixel gaps to UV radiation. A contact mask is shown but other methods will work as well, such as proximity and projection masks. A glass plate is placed on top making sure that the glass plate is horizontal. This ensures uniform contact between the tile and the mask. For the exemplary resist, exposure by a UV lamp (365 nm wavelength) for several minutes is suitable. If desired, a negative resist may be used instead of the positive resist (in which case, the exposure mask's transparent and opaque regions are reversed).

Figure 2F:
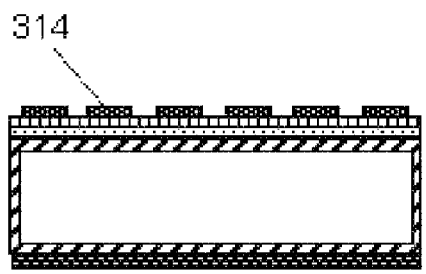

In step 6 shown in FIG. 2F, the exposed photoresist is developed. The resist developer (for example Microposit developer, MF-319) should cover the tile(s). The tiles are placed into the developer with the pixilated side facing up, developed for 2 minutes and the tile(s) are removed from the developer and rinsed in de-ionized water. The UV exposed resist is removed, in preparation for creating the interpixel gap.

In step 7 the remaining resist pixel pattern 314 is baked for 20 minutes at 90° C. This step is done to harden the resist further.

Figure 2G:
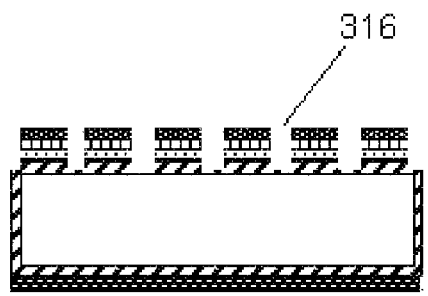

In step 8, shown in FIG. 2G, the exposed contact regions 316 (not covered by the pixel resist pattern 314) are etched. For the example contact materials, the following etching solution is suitable for etching through either just the primary contact layer or the optional three-layer contact. A 2% Br-Ethanol Glycol (BrEG) solution is prepared by pouring a 25 ml of Ethylene Glycol into a plastic beaker, then 0.5 ml of Bromine is added using a disposable pipette. Using the same pipette, the solution is mixed thoroughly until it becomes uniform. However, a different pipette or mixing device may also be used. Etching is conducted for approximately 3 minutes. This etching is done to remove unmasked interpixel contact material. To open the interpixel gap to achieve clean interpixel gaps, active spray agitation is performed. Disposable pipettes can be used to create Br-EG constant flow to agitate for better etching. However, a different pipette or agitation or mixing device may also be used. The spray etching technique should rapidly remove contact material flakes from the interpixel gaps, resulting in high interpixel resistance. The tiles are removed from the etchant and rinsed in deionized water.

Figure 2H:

In step 9 shown in FIG. 2H, the remaining resist is stripped using an acetone bath, resulting in tile 320 with a pixel array of contacts. No photoresist therefore remains on the CdTe or CdZnTe detector since it is usually a hygroscopic material that in time would absorb humidity and deteriorate the detector performance.

The overall combination of depositing the metal layer over the entire substrate surface at once, direct photolithography and the etching process results in the improved device interpixel resistance and performance.

Figure 2I:
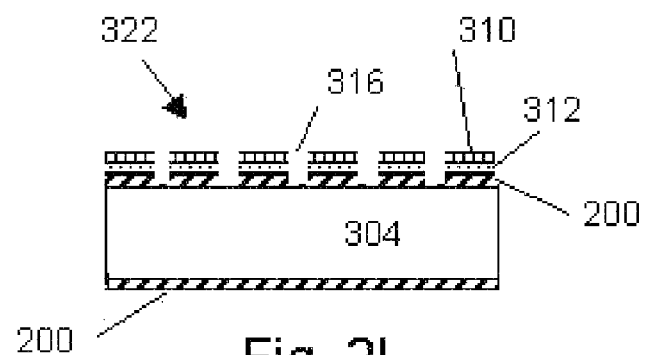

In step 10 shown in FIG. 2I, the primary contact material (in this example gold) on the sides of the fabricated CZT device 322 is removed by side polishing. For example, the side of the tile(s) are first polished with 1200 grit then with 0.3 micron as fine polish. An alternate embodiment could, in step 1, mask the sides of the CZT tile instead of depositing gold on all sides. For this reason, the side contact removal step 10 may be optional. The resulting fabricated CZT device has a cathode electrode 200 remaining on the front side, a pixilated anode electrode array formed of a primary contact layer 200, and secondary contact layers 312 and 310, separated by interpixel gaps 316. FIG. 2I illustrates the multi-layer pixels as being identical width in cross-section for illustrative purpose.

Figure 3A:
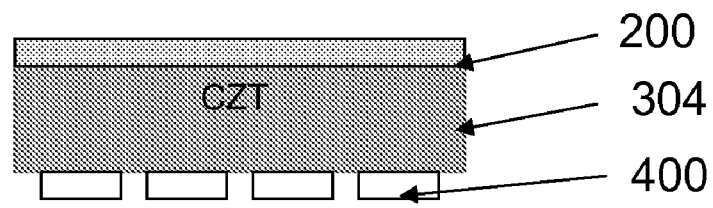
FIGS. 3A-C are schematic cross-sectional views of a method of making a detector with a housing.
Figure 3B:
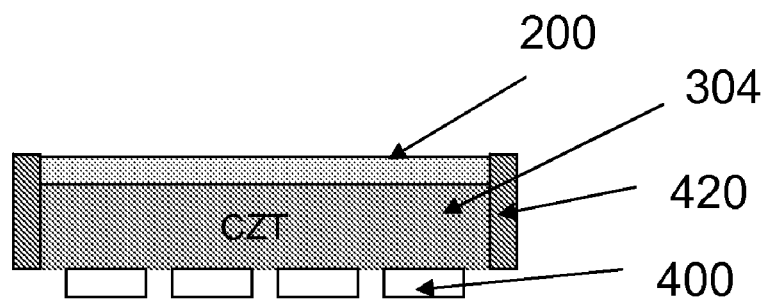

FIG. 3A shows the completed device containing the anode electrode pixels 400. Optionally, an edge coating 420 is applied to the polished side edges of the CZT tile as shown in FIG. 3B. For example, the CZT tile may be dipped in a protective coating (such as solder mask, silicone or epoxy) to cover the exposed sides and dried for at least 5 hours.

Cathode Housing (Optional)

Optionally, an electrically conductive housing may be attached to the detector cathode by (a) providing a radiation detector comprising a semiconductor substrate having opposing front and rear surfaces, a cathode electrode located on the front surface of said semiconductor substrate and a plurality of anode electrodes on the rear surface of said semiconductor substrate, (b) providing a separately formed electrically conductive housing, and (c) attaching the housing to the cathode electrode such that the housing and the cathode electrode are in electrical contact.

Figure 3C:
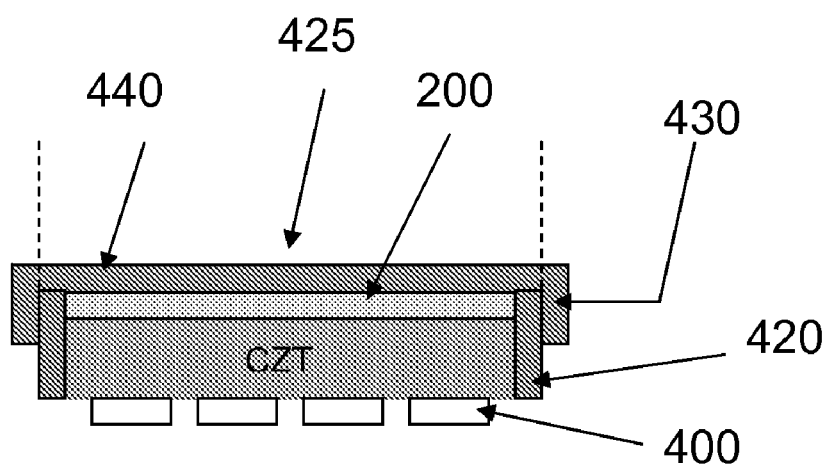

A non-limiting example of a housing is depicted in FIGS. 3A-C showing side cross-sectional views of a detector at various stages of attaching a housing thereto. Starting with FIG. 3A, a radiation detector and its basic elements, cathode electrode 200, semiconductor substrate 304 and anode electrodes 400, are shown. The detector may or may not comprise at least one of a guard ring or screening electrode. Next, an optional, electrically insulating edge coating 420, such as a solder mask, silicone (Humiseal) or UV curable epoxy is applied to edges of the substrate 304, as shown in FIG. 3B. Alternatively, this coating may be removed once a housing is formed thereon, resulting in an air gap between said housing and a side of the detector.

As shown in FIG. 3C, the electrically conductive housing is attached to the cathode and optionally the sides of the detector. In this illustration, the housing 425 comprises a top portion 440 and an optional side portion 430. The sides of the detector may or may not be glued to the edge coating 420 covering sides of the detector depending on various reasons such as for example, if one wishes to later remove the protective coating. In this example, the housing is attached to the cathode via an epoxy, although one skilled in the art may chose from other adhesives.

The electrically conductive housing 425 shields the detector from background electromagnetic fields (or magnetic fields). Additionally, device electric fields are focused using this housing. The housing is also preferably transparent to X-ray or gamma-ray radiation. Further, the housing preferably exhibits little or no oxidation in ambient air, such as under normal operating conditions of the detector. As such, the housing is most preferably a thin structure and comprises a material transparent to radiation, substantially impervious to background electromagnetic fields and exhibits little or no oxidation at ambient conditions.

For example the housing may be between about 50 microns and 100 microns thick. In some cases a metal foil is sufficient as a housing.

Based on the parameters set forth above, one skilled in the art may chose from a host of materials for constructing the housing. In general, metals and metallic alloys are preferred. Any suitable metal which does not substantially oxidize in air may be used. A non-limiting example of suitable metallic alloys includes stainless steel, brass (such Ni/Ti coated brass), NiCo alloys, NiFe alloys, NiFeCo alloys, NiFeMo alloys or NiFeCuMo alloys. A class of metal alloys termed "Mu-metals" is most preferred. Mu-metals are a type of NiFe alloy, particularly effective at screening static or low frequency magnetic fields. In some cases, the aforementioned alloys may be doped with other alloying elements, mechanically pre-treated (e.g. cold worked, hot worked etc.), chemically surface-treated (e.g. surface coating for corrosion resistance) or any combination thereof.

In some cases, the housing 425 is shaped to conform to geometry of the detector, more specifically, to geometry of the cathode, to which it is secured. Therefore, one skilled in the art may contemplate various curved or angular housing shapes given the shape of the detector. In a non-limiting example, the housing is a rectangular or circular-cross-sectioned (e.g. cylinder) shape.

When the housing is constructed to extend over (partially or completely) at least one side of the substrate, said at least one side is spaced from said housing. This gap is either empty or filled with an insulating material.

The housing 425 is attached to the cathode electrode 200 such that an electrical conduction path exists between the two. In a preferred case, the housing and the cathode are attached via an electrically conductive material. Most preferably, an electrically conducive polymeric material, such as a conductive epoxy applied to the inner face or surface of the housing is used.

Edge coatings 420 suitable for certain embodiments of the present application are described in U.S. application Ser. No. 11/642,819, filed on Dec. 21, 2006 which is hereby incorporated by reference in its entirely.

Detector-PCB Attachment

As described in U.S. application Ser. No. 11/642,819, the radiation detector may be connected to a readout printed circuit board (PCB), to process data obtained by the detector.

The present embodiments describe a detector device comprising a radiation detector attached to a device component such as a PCB, through an electrically conductive polymeric film. In one aspect, the electrically conductive polymeric film comprises electrically conductive wires (e.g., nanowires or metallic fibers), which are substantially aligned in the z-axis (film thickness axis) and traverse the thickness of film. In a further aspect, the electrically conductive film is an anisotropic conductive film (ACF).

In a further embodiment, a detector device comprises a CZT detector attached to a PCB through an ACF, wherein at least one bonding edge of the ACF is coated with an edge coating.

Anisotropic conductive films (ACFs) refer to a type of electrically conductive polymeric films having a polymeric matrix embedded with electrically conductive fillers. Also, an ACF conducts electricity in one direction (e.g. z-axis or film thickness) and insulates in another direction (e.g. x-y plane).

Though a number of ACFs exist in the market, to date, most are not suitable for bonding a radiation detector to a PCB. One reason, among others, is that typical application of an ACF involves compressing an ACF between two surfaces to be bonded, followed by curing. Thus, materials sensitive to high pressures and/or temperatures can not be bonded using this type of film. For example, a common type of ACF has a polymeric matrix with conductive spheres randomly distributed therein. The conductive spheres may be metal spheres (e.g. gold, silver, nickels or tin/lead mixtures) or metal coated polymer spheres. Forming a good electrical bond with this type of ACF requires large compressive forces, sometimes approaching a few hundred psi. Additionally, curing involves high temperatures, as about 150° C. or higher. Such conditions are not suitable for a CdZnTe (CZT) detector which is very sensitive to high temperatures and compressive forces.

The present inventors have found that a new type of electrically conductive film can be used to bond a detector which cannot withstand high temperatures and pressures, such as a CZT radiation detector to a PCB. This film comprises electrically conductive wires which are substantially aligned in the z-axis and traverse the thickness of film. Preferably, the wires are metallic nanowires (having a diameter of 1 micron or less) or other fibers. Also preferably, the metal nanowires have small pitch, such as less than 20 microns, for example 10-15 microns, such as 11-13 microns, which facilitates attachment of the film to small anode pixels.

In one embodiment, the density of the metallic nanowires is sufficient to conduct current between a detector anode and a PCB. In another embodiment, the density of the conductive nanowires is as high as practical without interfering with the adhesive properties of the film. In a non-limiting example, the nanowire density is up to 20 million per square inch of film. In the preferred embodiments, this film is an ACF conducting electricity across the thickness (z-axis) of the film and insulating in the plane of the film (x-y plane).

The composition of the metallic nanowires may vary so long as they remain electrically conductive. In a non-limiting example, the nanowires comprise NiO-coated Ni wires which may be slightly tilted off the z-axis depending on the polymer matrix.

The polymer matrix of the ACF preferably comprises an epoxy or a thermoplastic polymer. A favorable aspect of this ACF is that the compressive forces needed for bonding are generally at least ten times less than that for the aforementioned ACFs with conductive spheres and the ACF can be cured at a lower temperature, such as about 135° C. or less.

Figure 4A:
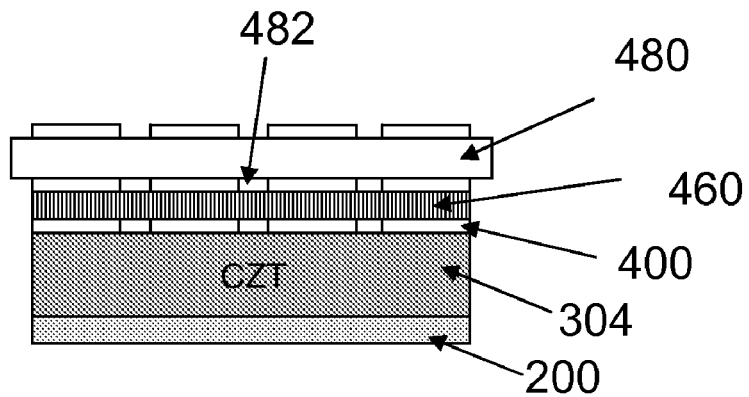
FIGS. 4A-C are cross-sectional views of a detector connected to a printed circuit board via an ACF.
Figure 4B:
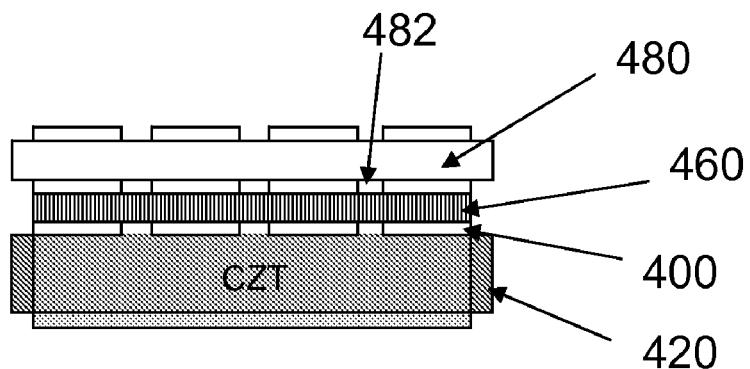
Figure 4C:
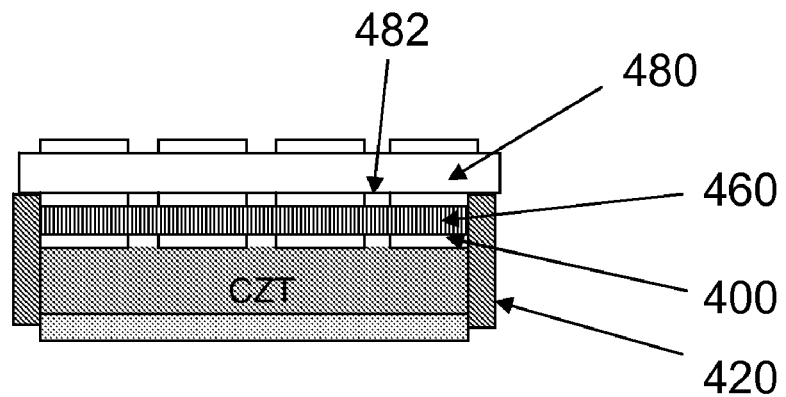

FIGS. 4A-C illustrate non-limiting examples of an ACF-bonded radiation detector device. As shown in FIG. 4A, an ACF 460 bonds and electrically connects a PCB 480 to the anode electrodes 400 on a CZT detector substrate 304. Although not shown, the ACF 460 may also occupy the anode interpixel regions. Likewise, the ACF 460 may also occupy regions between each PCB contact 482. FIGS. 4B and 4C illustrate the same device as FIG. 4A, but with the addition of an edge coating 420 for enhanced performance, which is described in further detail below. The edge coating 420 in FIG. 4C extends to cover the bonding line(s) of the ACF (i.e., the line between the ACF 460 and the PCB 480 and the line between the ACF 460 and the anodes 400).

Figure 5A:
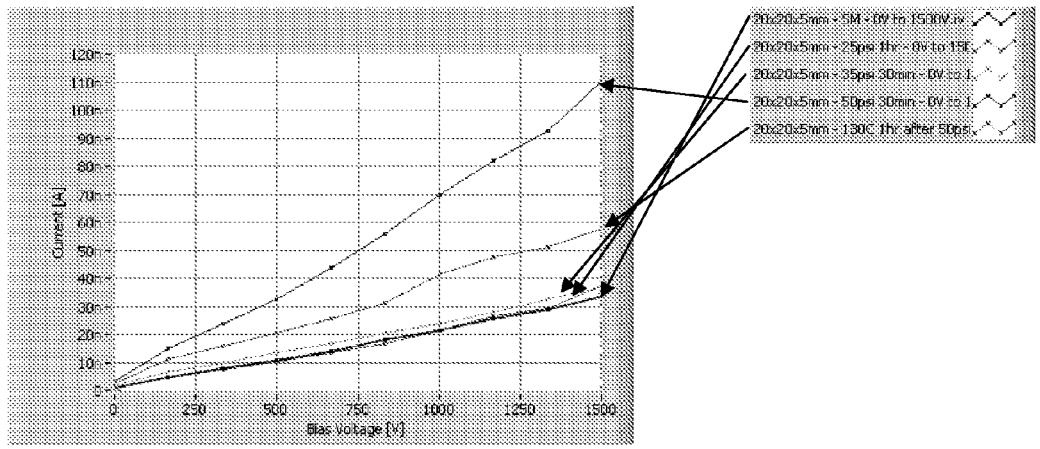
FIGS. 5A-B are data plots for current leakage in detector device samples under various temperature and compressive forces.
Figure 5B:
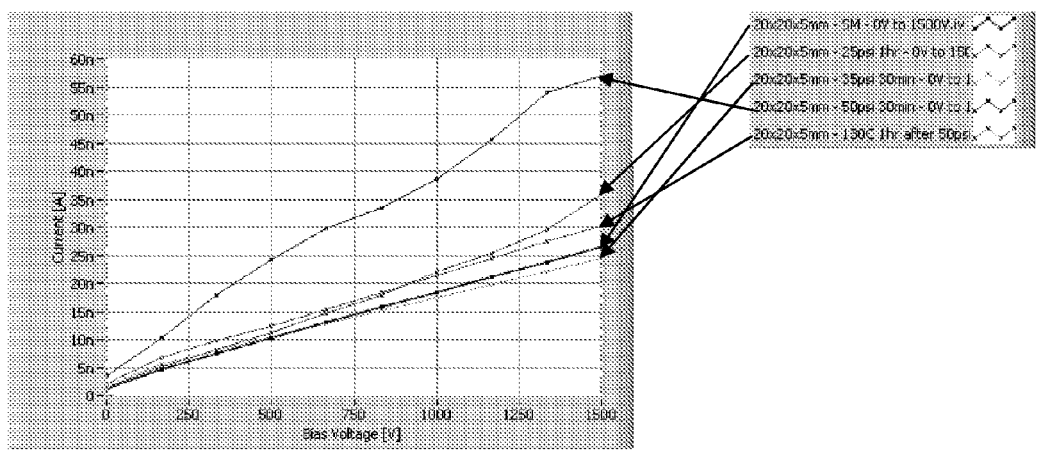

As mentioned, CZT detectors are sensitive to thermal and compressive loads. In order to assess device performance, the leakage current of a CZT detector device is measured under elevated temperatures and compressive forces. The test CZT detector device comprises a PCB connected to a CZT detector through a conductive plastic film used to mimic an ACF. The results are shown in the leakage current versus applied bias voltage plots in FIGS. 5A-B for two 20×20×5 mm samples. The top curve in both figures corresponds to a 50 psi compressive load applied for 30 minutes. Thus, using ACF manufacturer specifications of bonding at 50 psi results in large current leakages when the ACF is used to bond CZT detectors. This is particularly true for ACFs comprising a thermoplastic polymer matrix. The next curve from the top shows that the leakage current is reduced if the 50 psi bonding is followed by an anneal, such as a 130° C. anneal for 1 hour. The lower curves represent compressive loads of 35 psi and 25 psi applied for 30 minutes and one hour respectively. As evident, the current leakage significantly decreases at compressive loads of 35 psi or less.

According to an embodiment, one suitable bonding or attachment procedure involves bonding a PCB to a cleaned CZT detector by providing an ACF between the PCB and the detector anodes, and applying a compressive force of about 35 psi or less at an elevated temperature of about 135° C. or less. In a non-limiting example, the pressure is in the range of about 25 to about 35 psi. In another non-limiting example, the elevated temperature is in the range of about 90° C. to about 135° C., more preferably between 125° C. and 130° C. The duration of the elevated temperature, applied compressive force or both, is typically between five minutes and two hours including all values in this range. In some cases the temperature or applied compressive load may be applied for less than five minutes or more than two hours. A housing jig may used for alignment during the bonding step.

If desired, after the bonded device is cooled down and the compressive load is removed, an optional second anneal at a temperature between about 90° C. to about 135° C., such as between 125° C. and 130° C. may be carried out. If a thermally curable edge coating 420 is used, then the edge coating may be applied after the compressive load is removed but prior to the second anneal such that the edge coating is cured during the second anneal. If a UV curable edge coating 420 is used, then a UV radiation curing step is used.

The long term reliability of a CZT detector device is another concern when using ACF for attachment. Experiments on accelerated life test (ALT) of ACF attached samples show that device performance is stable under long term thermal cycling at high and low temperatures. However, performance can degrade under 2 hour or 24 hour hash tests at 85° C. and 85% relative humidity. One possible explanation for this effect is that moisture absorption into the ACF is responsible for the degradation. In support of this explanation, vacuum pumping experiments show that the absorbed moisture could be pumped away under the vacuum resulting in improved sample performance.

A method of reducing or preventing moisture absorption into the ACF, involves coating the bonding line of the ACF (ACF/PCB and ACF/detector interface lines) with a moisture resistant edge coating, as shown in FIG. 4C. To this end, a series of coating experiments are carried out. Tested coating materials include solder mask, silicone and UV curable (UV cure) epoxy. Each device's mean FWHM of spectra response for all pixels and total leakage current is compared before edge coating, after edge coating and after 2 hrs hash test. FIG. 6 displays results of these experiments.

Based on the coating materials tested, a preferred ACF edge coating material is UV cure epoxy, since it provides the desired combination of FWHM response and leakage current. One reason for the performance of the solder mask and silicone edge coatings may be due to the weakened ACF during the relatively high temperature curing of these materials. Therefore, room temperature curing is an advantage of the UV curable epoxy. Other compatible low temperature coating materials, such as acrylic resins, are viable candidates as edge coating materials.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited herein are incorporated herein by reference in their entirety.

What is claimed is:

1. A device, comprising:
    a radiation detector comprising:
        a semiconductor substrate having opposing front and rear surfaces;
        a cathode electrode located on the front surface of said semiconductor substrate; and
        a plurality of anode electrodes on the rear surface of said semiconductor substrate;
    a printed circuit board; and
    a polymeric film disposed between the printed circuit board and the anode electrodes, wherein the polymeric film comprises electrically conductive wires electrically connecting the radiation detector with the printed circuit board.

2. The device of claim 1, wherein the polymeric film is an anisotropic conductive film.

3. The device of claim 2, wherein the anisotropic conductive film comprises a thermoplastic polymer or an epoxy matrix in which the wires are located.

4. The device of claim 2, further comprising an edge coating covering bonding lines of the anisotropic conductive film.

5. The device of claim 4, wherein the edge coating comprises a UV curable epoxy, solder mask or silicone.

6. The device of claim 2, wherein the electrically conductive wires render the polymeric film an anisotropic conductive film.

7. The device of claim 1, wherein:
the semiconductor substrate comprises a CdTe or a CZT substrate; and
the polymeric film bonds to both the printed circuit board and to the anode electrodes at a temperature of about 135° C. or less and at a pressure of about 35 psi or less.

8. The device of claim 1, wherein the polymeric film which comprises electrically conductive wires contacts the anode electrodes.

9. A device, comprising:
a radiation detector comprising:
  a semiconductor substrate having opposing front and rear surfaces;
  a cathode electrode located on the front surface of said semiconductor substrate; and
  a plurality of anode electrodes on the rear surface of said semiconductor substrate;
a printed circuit board; and
a polymeric film disposed between the printed circuit board and the anode electrodes, wherein the polymeric film comprises electrically conductive wires electrically connecting the radiation detector with the printed circuit board, wherein the polymeric film is an anisotropic conductive film, and wherein the wires are metallic nanowires.

10. The device of claim 9, wherein the anisotropic conductive film comprises up to about 20 million nanowires per square inch.

11. The device of claim 9, wherein the nanowires comprise NiO coated Ni nanowires.

12. A method of electrically connecting a radiation detector to a printed circuit board, comprising:
providing a radiation detector comprising:
  a semiconductor substrate having opposing front and rear surfaces;
  a cathode electrode located on the front surface of said semiconductor substrate; and
  a plurality of anode electrodes on the rear surface of said semiconductor substrate;
providing a printed circuit board;
providing an electrically conductive polymeric film comprising electrically conductive wires in a polymer matrix between the printed circuit board and the plurality of anodes; and
bonding the radiation detector to the printed circuit board using at least one of a bonding temperature of 135° C. or less or a compressive force of about 35 psi or less.

13. The method of claim 12, wherein the step of bonding is conducted at the temperature of 135° C. or less.

14. The method of claim 12, wherein the step of bonding is conducted at the compressive force of about 35 psi or less.

15. The method of claim 12, wherein the step of bonding is conducted at the bonding temperature of 135° C. or less and the compressive force of about 35 psi or less.

16. The method of claim 15, wherein the step of bonding is conducted at the bonding temperature of about 125° C. to about 130° C. and the compressive force of about 25 psi to about 35 psi.

17. The method of claim 15, wherein the electrically conductive wires electrically connect the anode electrodes to the printed circuit board.

18. The method of claim 17, wherein the electrically conductive polymeric film is an anisotropic conductive film which comprises a thermoplastic polymer or an epoxy matrix in which the wires are located.

19. The method of claim 18, wherein the electrically conductive wires render the polymeric film an anisotropic conductive film.

20. The method of claim 17, further comprising applying an edge coating over bonding lines of the anisotropic conductive film.

21. The method of claim 20, wherein the edge coating comprises a UV curable epoxy, solder mask or silicone.

22. The method of claim 12, wherein the semiconductor substrate comprises a CdTe or a CZT substrate.

23. The method of claim 12, further comprising annealing the detector after the step of bonding to reduce a leakage current of the detector.

24. The method of claim 12, wherein the electrically conductive polymeric film contacts the printed circuit board and the plurality of anodes.

25. A method of electrically connecting a radiation detector to a printed circuit board, comprising:
providing a radiation detector comprising:
  a semiconductor substrate having opposing front and rear surfaces;
  a cathode electrode located on the front surface of said semiconductor substrate; and
  a plurality of anode electrodes on the rear surface of said semiconductor substrate;
providing a printed circuit board;
providing an electrically conductive polymeric film comprising electrically conductive wires in a polymer matrix between the printed circuit board and the plurality of anodes; and
bonding the radiation detector to the printed circuit board using a bonding temperature of 135° C. or less and a compressive force of about 35 psi or less,
wherein the electrically conductive wires electrically connect the anode electrodes to the printed circuit board, and
wherein the wires are metallic nanowires.

26. The method of claim 25, wherein the nanowires comprise NiO coated Ni nanowires.

* * * * *